(12) United States Patent
Nishimura et al.

(10) Patent No.: US 12,419,173 B2
(45) Date of Patent: Sep. 16, 2025

(54) ELECTRONIC DEVICE AND MANUFACTURING METHOD OF THE SAME

(71) Applicant: Magnolia White Corporation, Tokyo (JP)

(72) Inventors: Masumi Nishimura, Tokyo (JP); Hayata Aoki, Tokyo (JP)

(73) Assignee: Magnolia White Corporation, Tokyo (JP)

( * ) Notice: Subject to any disclaimer, the term of this patent is extended or adjusted under 35 U.S.C. 154(b) by 429 days.

(21) Appl. No.: 17/804,869

(22) Filed: Jun. 1, 2022

(65) Prior Publication Data

US 2022/0392981 A1    Dec. 8, 2022

(30) Foreign Application Priority Data

Jun. 2, 2021    (JP) .................................. 2021-092928

(51) Int. Cl.
*H10K 59/122*    (2023.01)
*H10K 59/12*    (2023.01)
(Continued)

(52) U.S. Cl.
CPC ......... *H10K 59/173* (2023.02); *H10K 59/122* (2023.02); *H10K 59/1201* (2023.02); *H10K 71/00* (2023.02)

(58) Field of Classification Search
CPC ............. H10K 59/173; H10K 59/1201; H10K 59/122; H10K 71/00; H10K 71/231; H10K 71/164
See application file for complete search history.

(56) References Cited

U.S. PATENT DOCUMENTS

| | | | |
|---|---|---|---|
| 6,037,712 A | 3/2000 | Codama et al. | |
| 6,111,356 A * | 8/2000 | Roitman | H10K 59/17 313/506 |

(Continued)

FOREIGN PATENT DOCUMENTS

| | | |
|---|---|---|
| CN | 101989613 A | 3/2011 |
| CN | 102668706 A | 9/2012 |

(Continued)

OTHER PUBLICATIONS

Office Action issued on Apr. 10, 2024, in corresponding Chinese Application No. 202210623964.6, 16 pages.

(Continued)

*Primary Examiner* — Mohsen Ahmadi
(74) *Attorney, Agent, or Firm* — Maier & Maier, PLLC

(57) ABSTRACT

According to one embodiment, an electronic device includes a lower electrode, a second insulating layer including an opening overlapping the lower electrode, an organic layer covering the lower electrode at the opening, an upper electrode covering the organic layer, and a barrier wall on the second insulating layer. The barrier wall includes a first layer formed of a metal material and including a first side surface which is in contact with the upper electrode, a second layer disposed above the first layer and extending from the first side surface toward the opening, and a protective layer formed of a material different from a material of the organic layer and covering at least an upper surface of the second layer.

6 Claims, 6 Drawing Sheets

(51) Int. Cl.
*H10K 59/173* (2023.01)
*H10K 71/00* (2023.01)
*H10K 71/16* (2023.01)
*H10K 71/20* (2023.01)

(56) References Cited

U.S. PATENT DOCUMENTS

| | | | |
|---|---|---|---|
| 6,699,728 B2* | 3/2004 | Guenther | H10K 59/173 |
| | | | 313/506 |
| 7,057,337 B1 | 6/2006 | Guenther | |
| 2002/0021089 A1 | 2/2002 | Kim | |
| 2009/0009069 A1 | 1/2009 | Takata | |
| 2012/0228603 A1 | 9/2012 | Nakamura | |
| 2016/0149155 A1 | 5/2016 | Kim | |
| 2017/0092863 A1* | 3/2017 | Bower | H10K 71/621 |
| 2019/0067390 A1 | 2/2019 | Gao | |
| 2019/0237527 A1 | 8/2019 | Lee et al. | |
| 2019/0259822 A1* | 8/2019 | Jeon | H10D 30/6723 |
| 2019/0334112 A1 | 10/2019 | Lee et al. | |
| 2019/0371871 A1 | 12/2019 | He et al. | |
| 2020/0194510 A1* | 6/2020 | Shin | H10K 59/80522 |
| 2020/0303687 A1 | 9/2020 | Liu | |
| 2020/0335566 A1* | 10/2020 | Yu | H01L 27/1259 |
| 2020/0403179 A1* | 12/2020 | Hu | H10K 50/844 |
| 2021/0359276 A1 | 11/2021 | Inari et al. | |
| 2022/0077257 A1 | 3/2022 | Choung et al. | |
| 2022/0123069 A1* | 4/2022 | Kim | H10K 59/124 |

FOREIGN PATENT DOCUMENTS

| | | |
|---|---|---|
| CN | 108832009 A | 11/2018 |
| CN | 109192886 A | 1/2019 |
| CN | 109817826 A | 5/2019 |
| CN | 110098222 A | 8/2019 |
| CN | 107565048 B | 5/2020 |
| CN | 111326675 A | 6/2020 |
| CN | 112689862 A | 4/2021 |
| CN | 116261925 A | 6/2023 |
| JP | H09330792 A | 12/1997 |
| JP | 2000-195677 A | 7/2000 |
| JP | 2007026866 A | 2/2007 |
| JP | 2007073284 A | 3/2007 |
| JP | 2019125501 A | 7/2019 |
| KR | 1020040005455 A | 1/2004 |
| WO | 2021071630 A1 | 4/2021 |

OTHER PUBLICATIONS

Office Action issued on Sep. 9, 2024, in corresponding Chinese Application No. 202210623964.6, 15 pages.
Office Action issued on Dec. 17, 2024, in corresponding Chinese Application No. 202210623964.6, 24 pages.
Office Action issued on Feb. 11, 2025, in corresponding German Application No. 102022205655.8, 9 pages.
Office Action issued on Mar. 19, 2025, in corresponding Indian Application No. 202214030536, 6 pages.

* cited by examiner

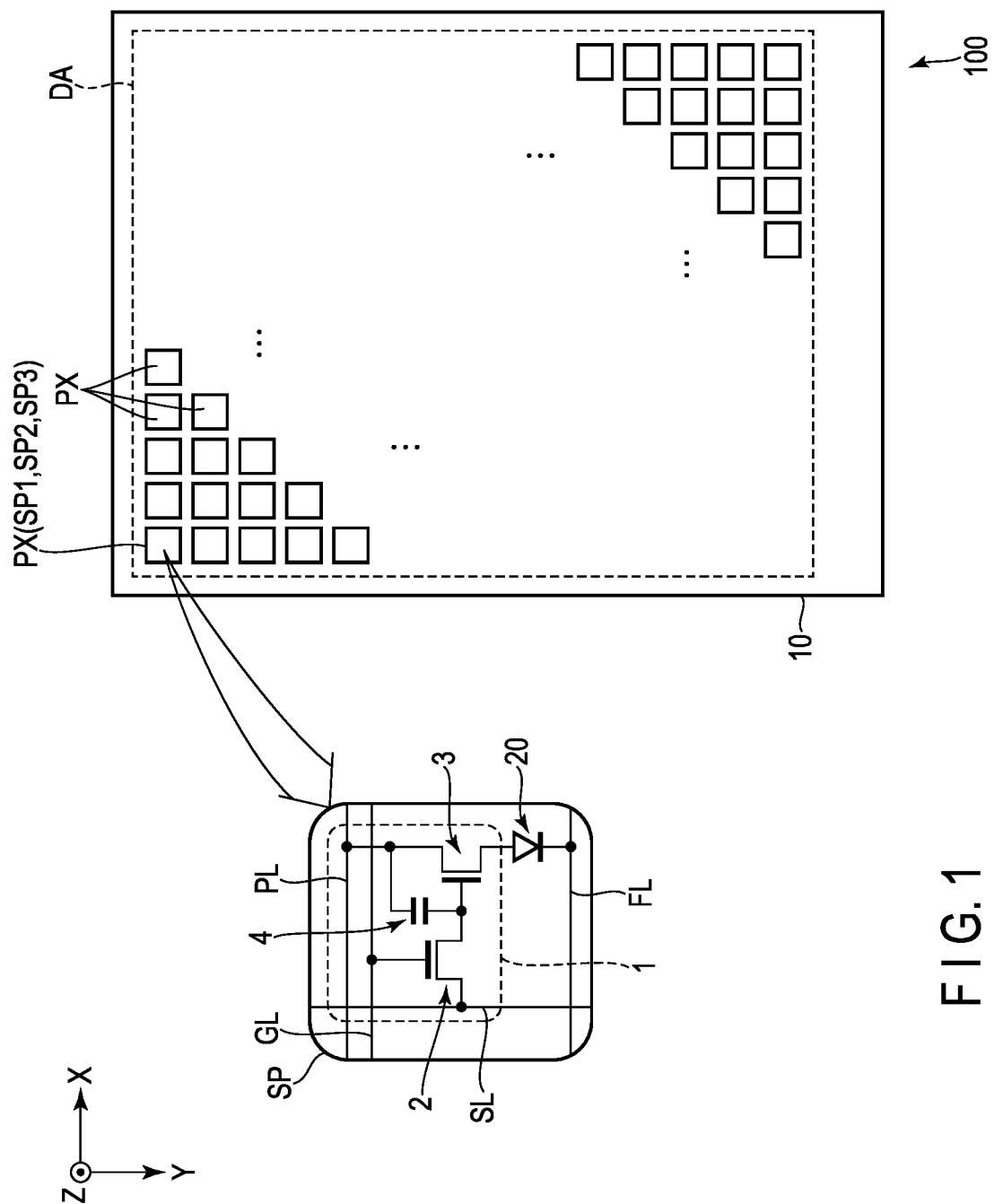
F I G. 1

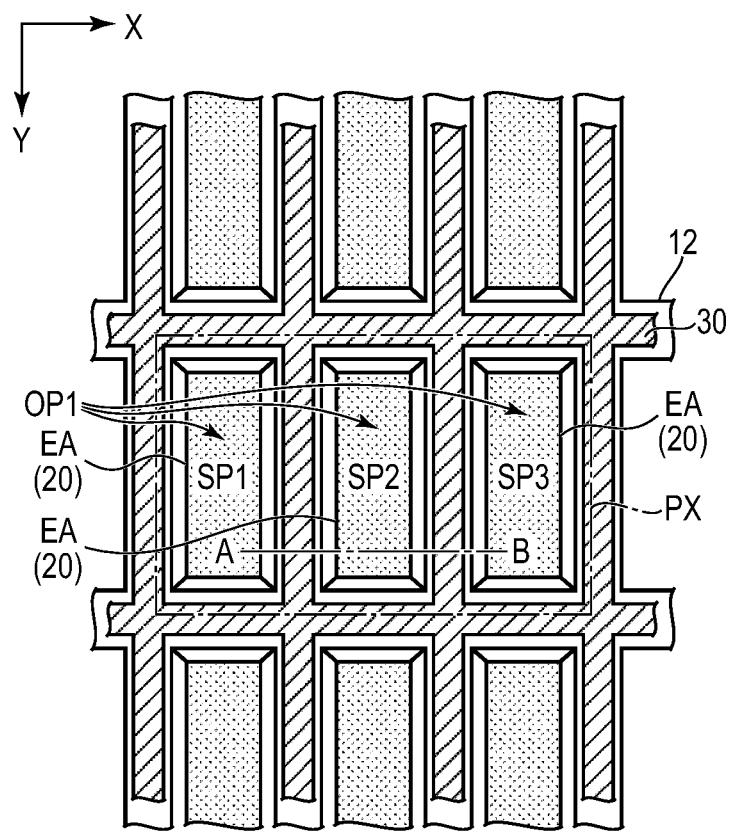
F I G. 2
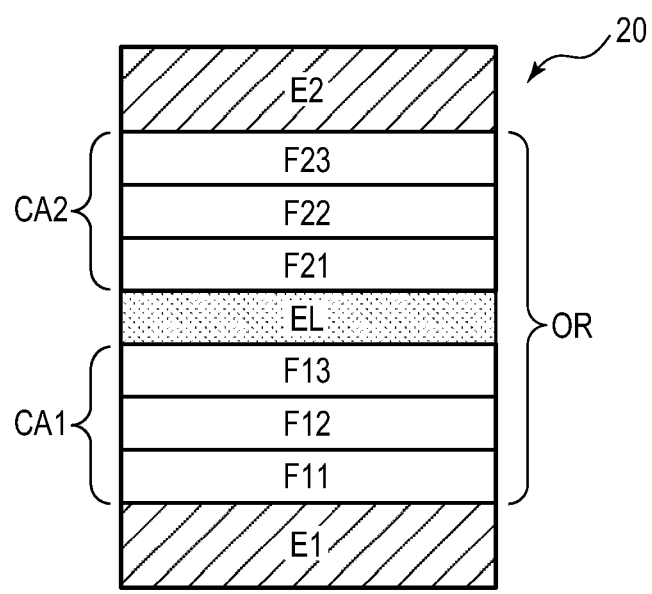
F I G. 3

ELECTRONIC DEVICE AND MANUFACTURING METHOD OF THE SAME

CROSS-REFERENCE TO RELATED APPLICATIONS

This application is based upon and claims the benefit of priority from Japanese Patent Application No. 2021-092928, filed Jun. 2, 2021, the entire contents of which are incorporated herein by reference.

FIELD

Embodiments described herein relate generally to an electronic device and a manufacturing method of the same.

BACKGROUND

Recently, display devices with organic light-emitting diodes (OLEDs) applied thereto as display elements have been put into practical use. Such a display element comprises an organic layer between a first electrode and a second electrode. For example, the organic layer is formed by vacuum deposition and the second electrode is formed by sputtering.

For example, in deposition using a mask, a fine mask including openings corresponding to respective pixels is applied. However, formation accuracy of a thin film formed by deposition may be deteriorated due to processing accuracy of the fine mask, deformation of the opening shape, and the like.

Thus, a technique of dividing the organic layer and the second electrode using a pixel division structure is known.

BRIEF DESCRIPTION OF THE DRAWINGS

FIG. 1 is a view showing a configuration example of an electronic device 100 according to embodiments.

FIG. 2 is a plan view showing an example of the pixel PX shown in FIG. 1.

FIG. 3 is a view showing an example of the configuration of the display element 20.

DETAILED DESCRIPTION

Figure 4:
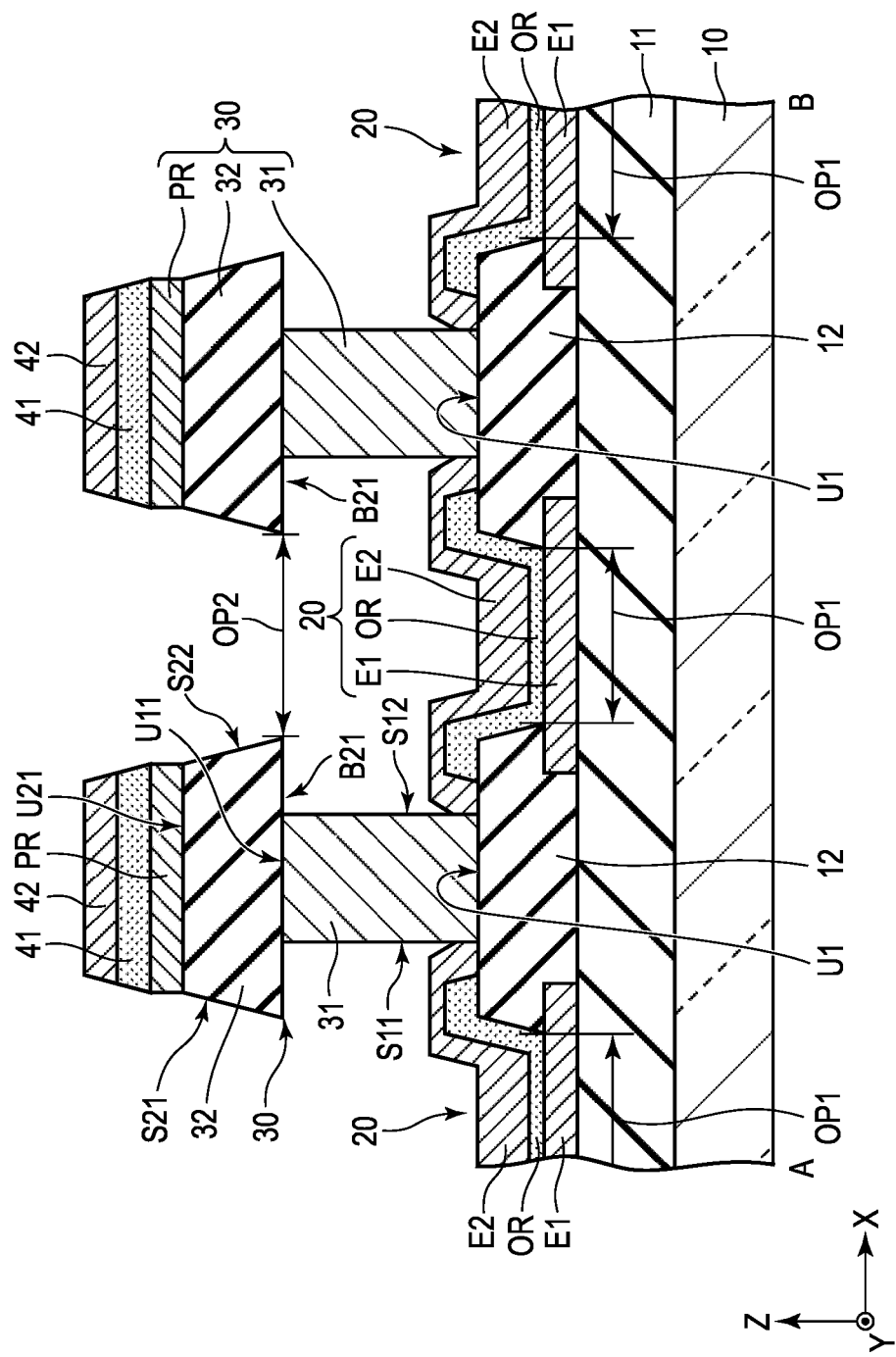
FIG. 4 is a cross-sectional view showing the electronic device 100 as viewed along line A-B shown in FIG. 2.

In general, according to one embodiment, an electronic device includes a substrate, a first insulating layer disposed on the substrate, a lower electrode disposed on the first insulating layer, a second insulating layer disposed on the first insulating layer and including an opening overlapping the lower electrode, an organic layer covering the lower electrode at the opening, an upper electrode covering the organic layer, and a barrier wall disposed on the second insulating layer. The barrier wall includes a first layer formed of a metal material and including a first side surface which is in contact with the upper electrode, a second layer disposed above the first layer and extending from the first side surface toward the opening, and a protective layer formed of a material different from a material of the organic layer and covering at least an upper surface of the second layer.

According to another embodiment, a method of manufacturing an electronic device, includes forming a lower electrode on a first insulating layer, forming a second insulating layer covering the first insulating layer and the lower electrode, forming a barrier wall on the second insulating layer, and forming an opening to expose the lower electrode in the second insulating layer. The barrier wall includes a first layer formed of a metal material and including a first side surface, a second layer disposed above the first layer and extending from the first side surface toward the opening, and a protective layer covering at least an upper surface of the second layer. The opening is formed by dry etching the second insulating layer using the barrier wall as a mask.

Embodiments will be described hereinafter with reference to the accompanying drawings.

The disclosure is merely an example, and proper changes in keeping with the spirit of the invention, which are easily conceivable by a person of ordinary skill in the art, come within the scope of the invention as a matter of course. In addition, in some cases, in order to make the description clearer, the widths, thicknesses, shapes and the like, of the respective parts are illustrated schematically in the drawings, rather than as an accurate representation of what is implemented. However, such schematic illustration is merely exemplary, and in no way restricts the interpretation of the invention. In addition, in the specification and drawings, structural elements which function in the same or a similar manner to those described in connection with preceding drawings are denoted by like reference numbers, detailed description thereof being omitted unless necessary.

In the drawings, an X-axis, a Y-axis and a Z-axis orthogonal to each other are described in the drawings to facilitate understanding as needed. A direction along the X-axis is referred to as an X-direction or a first direction, a direction along the Y-axis is referred to as a Y-direction or a second direction, and a direction along the Z-axis is referred to as a Z-direction or a third direction. A plane defined by the X-axis and the Y-axis is referred to as an X-Y plane. Viewing the X-Y plane is referred to as planar view.

The electronic device 100 according to the embodiments is, for example, a display device comprising a display element. The display element is, for example, an organic light emitting diode (OLED) comprising an organic light emitting layer. The display element can be applied as a light emitting element of an illumination device, and the electronic device 100 may be an illumination device comprising a light emitting element.

In addition, the electronic device 100 of the embodiments may also be a sensor device comprising a sensor element. The sensor element is, for example, an organic photodiode (OPD) comprising an organic photoelectric conversion layer.

FIG. 1 is a view showing a configuration example of the electronic device 100 according to the embodiments. The electronic device 100 comprises a display area DA where images are displayed, on an insulating base material 10. The base material 10 is an insulating substrate, and may be a glass substrate or a flexible resin film.

The display area DA comprises a plurality of pixels PX arrayed in a matrix in the first direction X and the second direction Y. Each of the pixels PX comprises a plurality of sub-pixels SP1, SP2, and SP3. For example, the pixel PX comprises a red sub-pixel SP1, a green sub-pixel SP2, and a blue sub-pixel SP3. In addition to the sub-pixels of the above three colors, the pixel PX may comprise four or more sub-pixels including a sub-pixel of the other color such as white. Alternatively, combination of the colors of the sub-pixels included in the pixel PX may be different from the combination of red, green, and blue.

A configuration example of one sub-pixel SP included in the pixel PX will be described in brief.

The sub-pixel SP comprises a pixel circuit 1 and a display element 20 driven by the pixel circuit 1. The pixel circuit 1 comprises a pixel switch 2, a drive transistor 3, and a capacitor 4. The pixel switch 2 and the drive transistor 3 are, for example, switch elements constituted by thin-film transistors.

In the pixel switch 2, a gate electrode is connected to a scanning line GL, a source electrode is connected to a signal line SL, and a drain electrode is connected to one of electrodes constituting the capacitor 4 and a gate electrode of the drive transistor 3. In the drive transistor 3, a source electrode is connected to the other electrode constituting the capacitor 4 and a power line PL, and a drain electrode is connected to an anode of the display element 20. A cathode of the display element 20 is connected to a feed line FL inside or outside the display area DA. The configuration of the pixel circuit 1 is not limited to the example shown in the figure.

The display element 20 is an organic light emitting diode (OLED) which is a light emitting element. For example, the sub-pixel SP1 comprises a display element that emits light corresponding to a red wavelength, the sub-pixel SP2 comprises a display element that emits light corresponding to a green wavelength, and the sub-pixel SP3 comprises a display element that emits light corresponding to a blue wavelength. The pixel PX can realize multicolor display by comprising a plurality of sub-pixels SP1, SP2, and SP3 of different display colors.

However, the pixel PX may also be configured such that the display element 20 of each of the sub-pixels SP1, SP2, and SP3 emits light of the same color. Monochromatic display can be thereby realized.

In addition, when the display element 20 of each of the sub-pixels SP1, SP2, and SP3 is configured to emit white light, a color filter opposed to the display element 20 may be disposed. For example, the sub-pixel SP1 may comprise a red color filter opposed to the display element 20, the sub-pixel SP2 may comprise a green color filter opposed to the display element 20, and the sub-pixel SP3 may comprise a blue color filter opposed to the display element 20. Multicolor display can be thereby realized.

Alternatively, when the display element 20 of each of the sub-pixels SP1, SP2, and SP3 is configured to emit ultraviolet light, multicolor display can be realized by disposing a light conversion layer opposed to the display element 20.

FIG. 2 is a plan view showing an example of the pixel PX shown in FIG. 1.

The sub-pixels SP1, SP2, and SP3 which constitute one pixel PX are formed in an approximately rectangular shape extending in the second direction Y and are arranged in the first direction X. The outline of each of the sub-pixels corresponds to an outline of a light emitting area EA in the display element 20, but is shown in a simplified form and does not necessarily reflect the actual shape. It is assumed here that the light emitting area EA is formed in a rectangular shape having shorter sides extending in the first direction X and longer sides extending in the second direction Y. An insulating layer 12, which will be described in detail later, is formed in a grating shape extending in the first direction X and the second direction Y, in planar view, to surround each of the sub-pixels SP1, SP2, and SP3 or the display element 20 of each of the sub-pixels. Such an insulating layer 12 may be referred to as a rib, a barrier wall, a bank, or the like. The light emitting area EA is formed in the opening OP1 of the insulating layer 12. A plurality of openings OP1 are arrayed in a matrix in the first direction X and the second direction Y.

A barrier wall 30, which will be described in detail later, is formed in a grating shape extending in the first direction X and the second direction Y, in planar view, and is disposed on the insulating layer 12. Each of the sub-pixels SP1, SP2, and SP3 is surrounded by the barrier wall 30.

The shape of the barrier wall 30 is not limited to the example shown in FIG. 2, but may be the other shape such as a stripe shape. In addition, the layout of the sub-pixels SP or the openings OP1 is not limited to the example shown in FIG. 2 either.

FIG. 3 is a view showing an example of the configuration of the display element 20.

The display element 20 comprise a lower electrode (first electrode) E1, an organic layer OR, and an upper electrode (second electrode) E2. The organic layer OR is disposed on the lower electrode E1, and the upper electrode E2 is disposed on the organic layer OR. The organic layer OR includes a carrier adjustment layer CA1, a light emitting layer EL, and a carrier adjustment layer CA2. The carrier adjustment layer CA1 is located between the lower electrode E1 and the light emitting layer EL, and the carrier adjustment layer CA2 is located between the light emitting layer EL and the upper electrode E2. The carrier adjustment layers CA1 and CA2 include a plurality of functional layers.

An example in which the lower electrode E1 corresponds to an anode and the upper electrode E2 corresponds to a cathode will be described.

The carrier adjustment layer CA1 includes a hole injection layer F11, a hole transport layer F12, an electron blocking layer F13, and the like, as functional layers. The hole injection layer F11 is disposed on the lower electrode E1, the hole transport layer F12 is disposed on the hole injection layer F11, the electron blocking layer F13 is disposed on the hole transport layer F12, and the light emitting layer EL is disposed on the electron blocking layer F13.

The carrier adjustment layer CA2 includes a hole blocking layer F21, an electron transport layer F22, an electron injection layer F23, and the like, as functional layers. The hole blocking layer F21 is disposed on the light emitting layer EL, the electron transport layer F22 is disposed on the hole blocking layer F21, the electron injection layer F23 is disposed on the electron transport layer F22, and the upper electrode E2 is disposed on the electron injection layer F23.

In addition to the functional layers described above, the carrier adjustment layers CA1 and CA2 may also include the other functional layers such as a carrier generation layer as needed or at least one of the above functional layers may be omitted in the carrier adjustment layers CA1 and CA2.

FIG. 4 is a cross-sectional view showing the electronic device 100 as viewed along line A-B shown in FIG. 2.

The display element 20 located in the center, of three display elements aligned in the first direction X shown in FIG. 2 as an example, will be focused.

The electronic device 100 comprises a base material 10, an insulating layer (first insulating layer) 11, an insulating layer (second insulating layer) 12, a display element 20, and a barrier wall 30. The insulating layer 11 is disposed on the base material 10 and corresponds to an underlying layer of the display element 20. The pixel circuit 1 shown in FIG. 1 is disposed on the base material 10 and is covered with the insulating layer 11. The insulating layer 12 is disposed on the insulating layer 11.

The lower electrodes E1 are disposed on the insulating layer 11, in the display element 20. A plurality of lower electrodes E1 are the electrodes which are arranged at intervals in the first direction X, and which are disposed for the respective sub-pixels or the respective display elements. Each of the lower electrodes E1 is electrically connected to the drive transistor 3 included in the pixel circuit 1 shown in FIG. 1 and may be referred to as pixel electrode, anode, or the like.

The lower electrodes E1 are transparent electrodes formed of, for example, a transparent conductive material such as indium tin oxide (ITO) or indium zinc oxide (IZO). The lower electrodes E1 may be metal electrodes formed of a metal material such as silver or aluminum. Alternatively, the lower electrodes E1 may be stacked layer bodies of transparent electrodes and metal electrodes. For example, the lower electrode E1 may be constituted as a stacked layer body formed by stacking a transparent electrode, a metal electrode, and a transparent electrode, in this order, or may be constituted as a stacked layer body of four or more layers.

The insulating layer 12 is disposed between the adjacent lower electrodes E1. In addition, the insulating layer 12 includes an opening OP1 and an upper surface U1. The insulating layer 12 is, for example, an inorganic insulating layer formed of a silicon nitride or the like. The opening OP1 is a through hole which is formed in an area overlapping the lower electrode E1 and which penetrates the insulating layer 12 to the lower electrode E1. A peripheral part of the lower electrode E1 is covered with the insulating layer 12, and a central part of the lower electrode E1 is exposed from the insulating layer 12 at the opening OP1.

The organic layer OR is disposed in the opening OP1 and covers the lower electrode E1. In the example shown in FIG. 4, the organic layer OR is also disposed on a part of the upper surface U1. Such an organic layer OR is disposed for each sub-pixel or each display element, similarly to the lower electrode E1.

The upper electrode E2 is stacked on the organic layer OR and covers an entire body of the organic layer OR including the peripheral part of the organic layer OR. In addition, the upper electrode E2 is in contact with the upper surface U1 outside the organic layer OR.

A part of the organic layer OR, which is located between the lower electrode E1 and the upper electrode E2, without intervening in the insulating layer 12, can form a light emitting area of the display element 20.

The upper electrode E2 is an electrode disposed for each sub-pixel or each display element, and a plurality of upper electrodes E2 are electrically connected to each other through the barrier wall 30 as described later. The upper electrode E2 may be referred to as a common electrode, a counter-electrode, a cathode or the like.

The upper electrode E2 is, for example, a semi-transparent metal electrode formed of a metal material such as magnesium or silver. The upper electrode E2 may be a transparent electrode formed of a transparent conductive material such as ITO or IZO. Alternatively, the upper electrode E2 may be a stacked layer body of transparent electrodes and metal electrodes.

The barrier wall 30 is located between the adjacent display elements 20 and disposed on the insulating layer 12. The barrier wall 30 is separated from the organic layer OR and is in contact with the upper electrodes E2. A left barrier wall 30, of two barrier walls 30 shown in FIG. 4, we will be focused and described in more detail. The barrier wall 30 on the right side of the figure has the same structure as the barrier wall 30 on the left side.

The barrier wall 30 includes a first layer 31, a second layer 32 disposed on the first layer 31, and a protective layer PR covering at least a part of the second layer 32.

The first layer 31 is, for example, a conductive layer formed of a metal material. The first layer 31 is located on the insulating layer 12 and is in contact with the upper surface U1. In addition, the first layer 31 is disposed between adjacent organic layers OR and between adjacent upper electrodes E2.

The first layer 31 has a side surface (first side surface) S11 which faces the opening OP1 (or the display element 20) on the left side of the figure, a side surface S12 which faces the opening OP1 (or the display element 20) in the center of the figure, and an upper surface U11 between the side surfaces S11 and S12. Each of the side surfaces S11 and S12 is in contact with the upper electrode E2. The upper electrodes E2 adjacent to each other with the barrier wall 30 sandwiched therebetween are thereby electrically connected to each other.

The second layer 32 is formed of a material different from that of the first layer 31, for example, an insulating material. For example, the second layer 32 is an inorganic insulating layer formed of a silicon nitride or the like, which is the same material as the insulating layer 12. The second layer 32 is in contact with the upper surface U11. In addition, the second layer 32 extends from the side surface S11 toward the opening OP1 on the left side of the figure, and further extends from the side surface S12 toward the opening OP1 in the center of the figure.

The second layer 32 has a side surface (second side surface) S21 which faces the opening OP1 on the left side of the figure, a side surface S22 which faces the opening OP1 in the center of the figure, and an upper surface U21 between the side surfaces S21 and S22. In addition, the second layer 32 has a bottom surface B21 between the side surfaces S21 and S22. A width of the bottom surface B21 along the first direction X is larger than that of the upper surface U21 along the first direction X.

The protective layer PR is disposed to cover the upper surface U21 of the second layer 32. In the example illustrated, the side surfaces S21 and S22 are exposed from the protective layer PR. The protective layer PR is formed of a material different from the organic layer OR. The protective layer PR is, for example, a metal layer which is formed of a metal material such as titanium, aluminum, molybdenum, tungsten, copper, or silver.

The opening OP2 surrounded by the second layer 32 of the barrier wall 30 has substantially the same size as the opening OP1 of the insulating layer 12, but the opening OP2 may be smaller than the opening OP1.

A layer 41 formed of the same material as the organic layer OR of the display element 20 and a layer 42 formed of the same material as the upper electrode E2 are stacked as deposits, on the barrier wall 30. The layer 41 is in contact with the protective layer PR. In addition, the layer 41 is separated from the organic layer OR of the display element 20. The layer 42 is in contact with the layer 41. In addition, the layer 42 is separated from the upper electrode E2 of the display element 20.

The display element 20 and the barrier wall 30 are covered with a sealing film whose illustration in the figure is omitted.

Next, a method of manufacturing the above-described electronic device 100 will be described with reference to FIG. 5 and FIG. 6.

Figure 5:
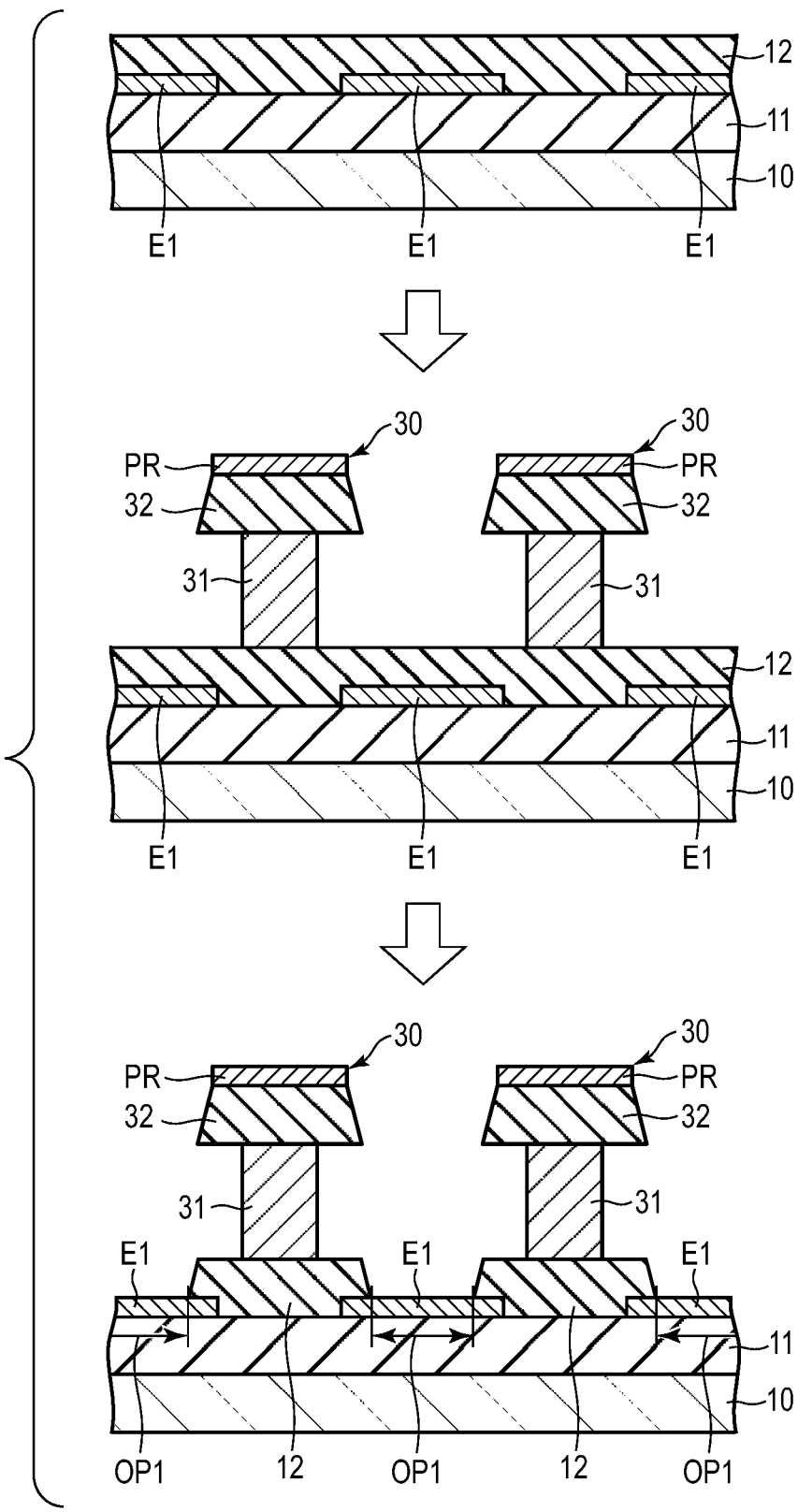
FIG. 5 is a view illustrating a method of manufacturing the electronic device 100.

First, as shown in the upper stage in FIG. 5, the pixel circuits 1 and the like shown in FIG. 1 are formed on the base material 10 and then the insulating layer 11 is formed. Then, after the conductive material is formed on the insulating layer 11, this conductive material is patterned in a predetermined shape, and the lower electrodes E1 are thereby formed. Then, the insulating layer 12 covering the insulating layer 11 and the lower electrodes E1 is formed.

Then, as shown in the middle stage, the barrier wall 30 comprising the first layer 31, the second layer 32, and the protective layer PR is formed on the insulating layer 12. An example of a method of forming the barrier wall 30 will be described below.

First, the first metal layer is formed to form the first layer 31 on the insulating layer 12, the insulating layer is formed to form the second layer 32 on the first metal layer, and the second metal layer is formed to form the protective layer PR on the insulating layer.

Then, the protective layer PR is formed by patterning (for example, wet etching) the second metal layer into a predetermined shape.

Then, the second layer 32 is formed by etching (for example, dry etching) the insulating layer using the protective layer PR as a mask. In the etching, a resist may be provided to protect the second layer 32.

Then, the first metal layer is etched (for example, wet etched) using the protective layer PR and the second layer 32 as masks, and the first layer 31 is thereby formed. In the etching, a resist may be provided to protect the protective layer PR and the second layer 32. The barrier wall 30 is formed through these processes.

The etching of the second metal layer and the insulating layer may be wholly performed, the etching of the first metal layer and the insulating layer may be wholly performed, or the etching of the first metal layer, the insulating layer, and the second metal layer may be wholly performed. In addition, the method of forming the barrier wall 30 is not limited to the method described here.

Then, as shown in the lower stage, the opening OP1 is formed in the insulating layer 12 to expose the lower electrodes E1. At this time, the openings OP1 are formed by dry etching the insulating layer 12 using the barrier wall 30 as a mask.

Thus, since the lower electrodes E1 are exposed from the insulating layer 12 after forming the barrier wall 30, the lower electrodes E1 are not exposed to an etchant when forming the barrier wall 30. For example, when the barrier wall 30 is formed after forming the openings OP1, the lower electrodes E1 exposed through the openings OP1 may be damaged by an etchant for forming the first layer 31 of the barrier wall 30 or an etchant for forming the protective layer PR. For this reason, damage to the lower electrodes E1 can be reduced by forming the openings OP1 for exposing the lower electrodes E1 after forming the barrier wall 30 as described above.

In addition, when dry etching the insulating layer 12 using the barrier wall 30 as a mask, the second layer 32 of the barrier wall 30, which is the insulating layer of the same type as the insulating layer 12, is protected by the protective layer PR. For this reason, in the dry etching process of the insulating layer 12, the exposed insulating layer 12 is removed while the second layer 32 covered with the protective layer PR is protected, and the openings OP1 having a desired shape can be formed. The reduction in reliability can be thereby suppressed.

Figure 6:
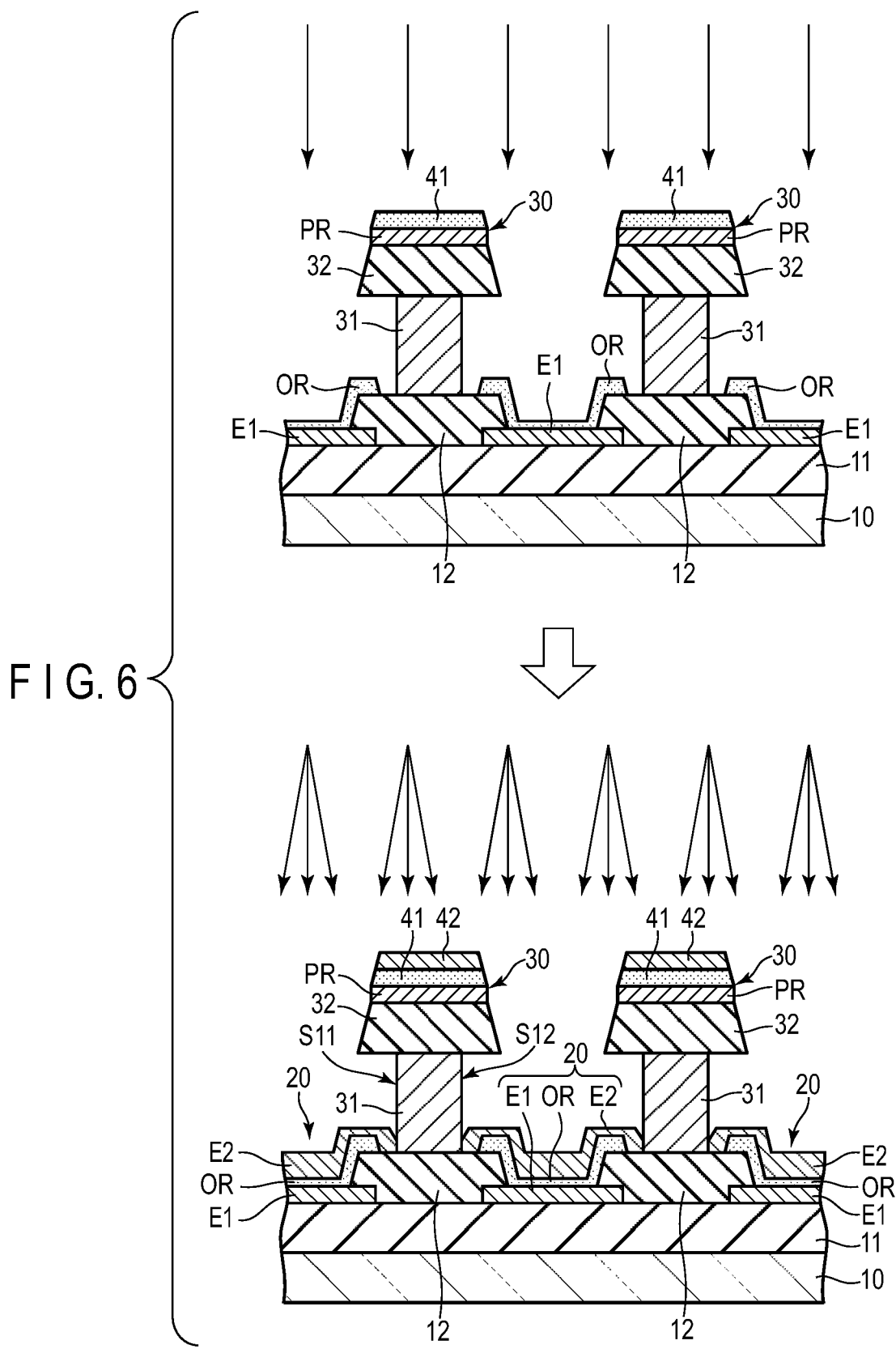
FIG. 6 is a view illustrating a method of manufacturing the electronic device 100.

Next, as shown in an upper stage in FIG. 6, the organic layer OR is formed on the lower electrodes E1 by, for example, vacuum deposition, using the barrier wall 30 as a mask. At this time, vapor from an evaporation source passes through the area where the barrier wall 30 does not exist, and reaches upper surfaces of the lower electrodes E1 and the insulating layer 12. Vapor from the evaporation source does not reach the area in the shadow of the second layer 32 of the barrier wall 30. The layer 41 of the same material as the organic layer OR is deposited on the protective layer PR.

Then, as shown in the lower stage, the upper electrodes E2 are formed on the organic layer OR by, for example, sputtering, using the barrier wall 30 as a mask. At this time, vapor from the evaporation source passes through the area where the barrier wall 30 does not exist, reaches the upper surface of the organic layer OR and the insulating layer 12 and also reaches the side surfaces S11 and S12 of the first layer 31. The layer 42 of the same material as the upper electrodes E2 is deposited on the layer 41.

As described above, the organic layer OR and the upper electrodes E2 of the display element 20 are formed without applying a fine mask. For this reason, the manufacturing costs can be reduced as compared with a case where a fine mask is applied, and processes such as positioning a fine mask are not required, and the organic layer OR and the upper electrodes E2 of the desired shape can easily be formed. In addition, the light emitting areas can be formed in predetermined areas and undesired light emission in the areas overlapping the insulating layer 12 is suppressed, in the display element 20.

Next, another configuration example of the barrier wall 30 will be described.

Figure 7:
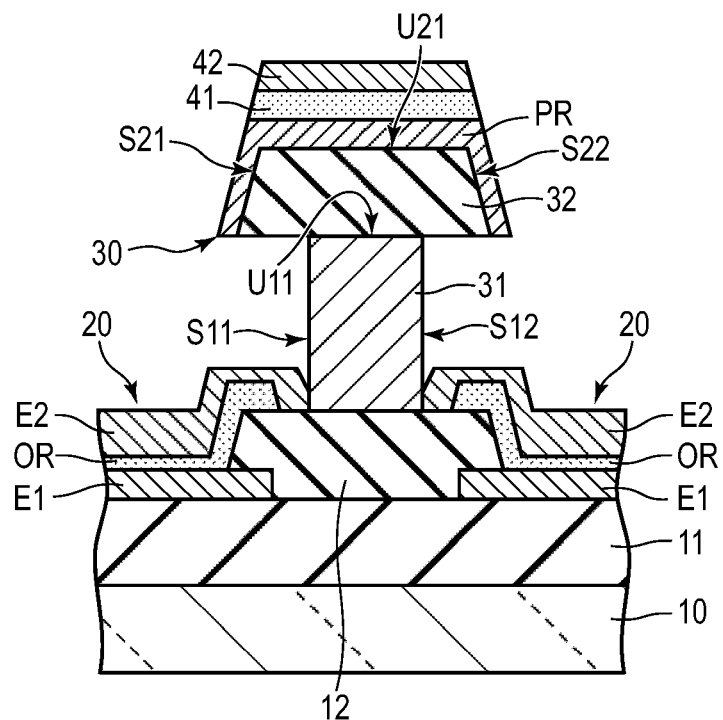
FIG. 7 is an enlarged cross-sectional view showing another configuration example of the barrier wall 30.

FIG. 7 is an enlarged cross-sectional view showing another configuration example of the barrier wall 30. The configuration example shown in FIG. 7 is different from the configuration example shown in FIG. 4 in that the protective layer PR covers the upper surface U21 of the second layer 32 as well as the side surfaces S21 and S22.

An example of a method of forming the barrier wall 30 having such a shape will be described.

First, the first metal layer is formed to form the first layer 31 on the insulating layer 12, and the insulating layer is formed to form the second layer 32 on this first metal layer.

Then, the insulating layer is patterned (for example, dry etched) in a predetermined shape, and the second layer 32 having the upper surface U21 and the side surfaces S21 and S22 is thereby formed.

Then, after forming the second metal layer on the second layer 32, the second metal layer is patterned (for example, wet etched) in a predetermined shape, and the protective layer PR covering the upper surface U21 and the side surfaces S21 and S22 is thereby formed.

Then, the first metal layer is etched (for example, wet etched) using the protective layer PR and the second layer 32 as masks, and the first layer 31 is thereby formed.

After forming the barrier wall 30 in such a shape, the openings OP1 are formed in the insulating layer 12 to expose the lower electrodes E1 as shown in the lower stage in FIG. 5. At this time, the openings OP1 are formed by dry etching the insulating layer 12 using the barrier wall 30 as a mask.

When dry etching the insulating layer 12 using the barrier wall 30 as a mask, the upper surface U21, and the side surfaces S21 and S22 of the second layer 32, which is the insulating layer of the same type as the insulating layer 12, are protected by the protective layer PR. For this reason, the shape of the second layer 32 can be maintained in the dry etching process of the insulating layer 12, and in the process of forming the organic layer OR and the process of forming the upper electrode E2, which are performed subsequently, the second layer 32 can exert the function as the mask for forming the organic layer OR and the upper electrodes E2 having desired shapes.

Figure 8:
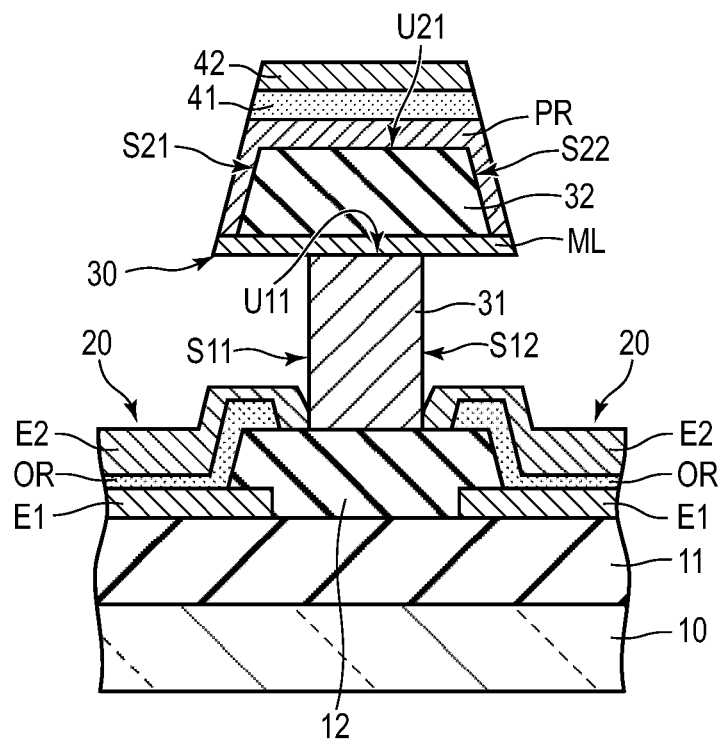
FIG. 8 is an enlarged cross-sectional view showing the other configuration example of the barrier wall 30.

FIG. 8 is an enlarged cross-sectional view showing the other configuration example of the barrier wall 30.

The configuration example shown in FIG. 8 is different from the configuration example shown in FIG. 4 in that the barrier wall 30 comprises an intermediate layer ML located between the first layer 31 and the second layer 32.

The intermediate layer ML is formed of a material different from that of the second layer 32, for example, the same metal material as that of the protective layer PR. The intermediate layer ML is in contact with the upper surface U11. In addition, the intermediate layer ML extends from the side surface S11 toward the left side of the figure and also extends from the side surface S12 toward the right side of the figure.

The second layer 32 is disposed on the intermediate layer ML and is in contact with the intermediate layer ML. The side surfaces S21 and S22 and the upper surface U21 of the second layer 32 are covered with the protective layer PR. In addition, the protective layer PR is in contact with the intermediate layer ML. In other words, the entire second layer 32 is covered with the protective layer PR and the intermediate layer ML.

For this reason, as shown in the lower stage of FIG. 5, when dry etching the insulating layer 12 using the barrier wall 30 as a mask, the entire second layer 32, which is an insulating layer of the same type as the insulating layer 12, is protected by the protective layer PR and the intermediate layer ML. Therefore, the shape of the second layer 32 can be maintained in the dry etching process of the insulating layer 12. In the process of forming the organic layer OR and the process of forming the upper electrodes E2, the second layer 32 can exert the function as the mask for forming the organic layer OR and the upper electrodes E2 having the desired shapes.

According to the embodiments described above, an electronic device whose reduction in reliability is suppressed and a manufacturing method thereof can be provided.

All of the electronic devices that can be implemented by a person of ordinary skill in the art through arbitrary design changes to the electronic devices described above as embodiments of the present invention come within the scope of the present invention as long as they are in keeping with the spirit of the present invention.

Various types of the modified examples are easily conceivable within the category of the ideas of the present invention by a person of ordinary skill in the art and the modified examples are also considered to fall within the scope of the present invention. For example, additions, deletions or changes in design of the constituent elements or additions, omissions, or changes in condition of the processes arbitrarily conducted by a person of ordinary skill in the art, in the above embodiments, fall within the scope of the present invention as long as they are in keeping with the spirit of the present invention.

In addition, the other advantages of the aspects described in the embodiments, which are obvious from the descriptions of the present specification or which can be arbitrarily conceived by a person of ordinary skill in the art, are considered to be achievable by the present invention as a matter of course.

What is claimed is:

1. An electronic device comprising:
   a substrate;
   a first insulating layer disposed on the substrate;
   a lower electrode disposed on the first insulating layer;
   a second insulating layer disposed on the first insulating layer and including an opening overlapping the lower electrode;
   an organic layer covering the lower electrode at the opening;
   an upper electrode covering the organic layer; and
   a barrier wall disposed on the second insulating layer, wherein
   the barrier wall comprises:
   a first layer formed of a metal material and including a first side surface which is in contact with the upper electrode;
   a second layer disposed above the first layer and extending from the first side surface toward the opening;
   an intermediate layer located between the first layer and the second layer; and
   a protective layer formed of a material different from a material of the organic layer and covering at least an upper surface of the second layer;
   the intermediate layer extends from the first side surface toward the opening, and
   the protective layer covers a second side surface of the second layer and is in contact with the intermediate layer.

2. The electronic device of claim 1, wherein
   the second layer is an inorganic insulating layer formed of a same material as a material of the second insulating layer.

3. The electronic device of claim 1, wherein
   the protective layer is a metal layer formed of a metal material.

4. A method of manufacturing an electronic device, the method comprising:
   forming a lower electrode on a first insulating layer;
   forming a second insulating layer covering the first insulating layer and the lower electrode;
   forming a barrier wall on the second insulating layer; and
   forming an opening to expose the lower electrode in the second insulating layer, wherein
   the barrier wall comprises:
   a first layer formed of a metal material and including a first side surface;
   a second layer disposed above the first layer and extending from the first side surface toward the opening;
   an intermediate layer between the first layer and the second layer; and
   a protective layer covering at least an upper surface of the second layer;
   the intermediate layer extends from the first side surface toward the opening,
   the protective layer covers a second side surface of the second layer and is in contact with the intermediate layer, and
   the opening is formed by dry etching the second insulating layer using the barrier wall as a mask.

5. The method of claim 4, further comprising:
   forming the opening and then forming an organic layer on the lower electrode in the opening,
   wherein the organic layer is formed by vacuum deposition using the barrier wall as a mask.

6. The method of claim 5, further comprising:

forming the organic layer and then forming an upper electrode on the organic layer, wherein the upper electrode is formed by sputtering using the barrier wall as a mask.

\* \* \* \* \*